United States Patent [19]

NessAiver

[11] Patent Number: 5,722,410
[45] Date of Patent: Mar. 3, 1998

[54] APPARATUS AND METHOD FOR AUTOMATED DETERMINATION OF SURFACE COIL COORDINATES TO CORRECT SIGNAL INHOMOGENEITIES IN MAGNETIC RESONANCE SIGNALS

[75] Inventor: Moriel S. NessAiver, Baltimore, Md.

[73] Assignee: Picker International, Inc., Highland Heights, Ohio

[21] Appl. No.: 664,386

[22] Filed: Jun. 14, 1996

[51] Int. Cl.⁶ .................................................. A61B 5/055
[52] U.S. Cl. ............................. 128/653.2; 128/653.5; 324/309; 324/318; 324/322
[58] Field of Search ................... 128/653.2, 653.5; 324/307, 309, 318, 322

[56] References Cited

U.S. PATENT DOCUMENTS

| | | | |
|---|---|---|---|
| 4,617,936 | 10/1986 | Malko | 128/653.2 |
| 4,636,730 | 1/1987 | Bottomley | 324/318 |
| 4,918,388 | 4/1990 | Mehdizadeh et al. | 324/322 |
| 5,050,607 | 9/1991 | Bradley et al. | 128/653.2 |
| 5,529,069 | 6/1996 | Andoh | 128/653.5 |
| 5,600,244 | 2/1997 | Jensen et al. | 128/653.2 |

OTHER PUBLICATIONS

Chapter 4 of Ph.D Dissertation entitled "Surface Coils", by Moriel S. NessAiver, Jul. 1988.

Surface Coil MR Imaging of the Human Brain with an Analytic Reception Profile Correction, Moyher, et al. JMRI, Mar./Apr. 1995, pp. 139–144.

Calculation of Sensitivity Correction Factors For Surface Coil MRS, Doyle, et al. MRM 33:108–112 (1995).

Computer Modeling of Surface Coil Sensitivity, Lawry, et al. MRM 16:294–302 (1990).

Medrad Advertising Brochure 1995 (93068-00-BA-01 Rev A).

Medrad Advertising Brochure 1994 (90312-00-BA-01).

Medrad Advertising Brochure 1994 (93214-00-BA-01).

Medrad Advertising Brochure 1994 (93215-00-BA-01).

*Primary Examiner*—Ruth S. Smith
*Attorney, Agent, or Firm*—Fay, Sharpe, Beall, Fagan, Minnich & McKee

[57] ABSTRACT

A surface coil (26) is positioned against a subject in the image region to detect emanating radio frequency resonance signals. The detected signals are processed (52) into a magnetic resonance images representing the image region which include an image value for each of an array of pixel coordinates. There is a large change in magnitude between image values of pixels corresponding to the coil and adjacent pixels. Magnitudes and directions of pixel value change gradients are calculated (60) from the image values corresponding to pixels in each of a first set of magnetic resonance image slices representing axial and transaxial slices through the surface coil. A coordinate calculator (62) calculates image region coordinates corresponding to segments of the surface coil. From the image region coordinates of the surface coil segments, a surface coil sensitivity calculator (92) calculates coil sensitivity which is in turn used to enhance (94) the reconstructed images.

21 Claims, 4 Drawing Sheets

APPARATUS AND METHOD FOR AUTOMATED DETERMINATION OF SURFACE COIL COORDINATES TO CORRECT SIGNAL INHOMOGENEITIES IN MAGNETIC RESONANCE SIGNALS

BACKGROUND OF THE INVENTION

The present invention generally relates to the magnetic resonance (hereinafter "MR") imaging arts. It finds particular application in prostrate imaging and will be described with particular reference thereto. It is to be appreciated, however, that the present invention also finds utility in other magnetic resonance applications in which the receiving coil is inserted in internal cavities of the subject.

Cancer of the prostate gland is one of the leading causes of death among elderly men. Diagnostic blood tests for prostate cancer are imperfect, and the disease is often well-advanced by the time it is first diagnosed. Consequently, better diagnostic techniques are needed. MR imaging provides a useful tool in detecting and treating prostate cancer.

Briefly, MR imaging makes use of magnetic fields and radio frequency waves to generate resonance intensity images of selected cross-sections of the patient's body. MR imaging systems generally include a large magnet for generating a main magnetic field into which is immersed the patient being analyzed. For imaging purposes, the main magnetic field is selectively altered in one or more directions by a plurality of gradient coils. An excitation coil generates radio frequency waves causing specific nuclei within the gradient field to resonate and generate radio frequency resonance signals. A surface coil or a local body coil detects the radio frequency resonance signals.

After detection, the radio frequency resonance signals are converted to resonance data which are then processed by a computer system to produce images for clinical diagnosis. The images depend upon the number of nuclei involved in the imaging region and specific tissue parameters. Variations in patient nuclei density produces a good contrast in MR imaging and is therefore useful in differentiating among different tissues of the human body.

Obviously, it is desirable to obtain an image having high resolution so that clinical diagnosis can be as precise as possible. High resolution imaging is also critical in determining cancer growth at early stages where treatment of the disease is most effective. Ideally, the coil used to detect the resonance signals should be positioned as close to the patient as possible in order to maximize the imaging sensitivity, i.e., signal to noise ratio, and thus the resolution of the resulting image. Surface coils are advantageous over body coils insofar as surface coils can be placed closer to the tissue under examination.

A technique which uses a modified surface coil has been developed to improve image resolution. Briefly, the technique uses a flexible surface coil secured to an inflatable balloon, the combination of which is passed into a body cavity near the prostate gland while the balloon is in a collapsed state. Fluid, such as air under pressure, is then applied to the interior of the balloon, thereby expanding opposite sides of the surface coil. In the expanded state, the surface coil can be effectively used to detect signals of nearby resonating body tissue. After data is collected, the balloon is deflated to its normal collapsed state, which allows the balloon and the surface coil to be removed from the body cavity. This technique allows the surface coil to be placed as close as possible to the tissue of interest, e.g., the prostate gland.

If the position of the surface coil relative to the tissue imaged is known, then the resolution of the images can be further enhanced using a technique devised by the inventor herein. The technique involves calculating coil sensitivity from surface coil position inside the patient cavity. Thereafter, the coil sensitivity is used to normalize the images. Normalized images improve resolution.

To determine the coil sensitivity of a flexible surface coil, the position of coil segments within the cavity of the patient are determined. However, once the surface coil is inserted into the patient cavity, the surface coil takes different shapes and orientations depending upon the surrounding anatomy and pressure used to expand the coil. Unless the shape and orientation of the surface coil is accurately known, the coil sensitivity cannot be calculated accurately. An obvious problem is that once the coil is inserted into the body cavity, its shape and orientation are not visibly determinable.

The inventor herein has devised a technique for determining the position of all points of a flexible surface coil after it is placed in the body cavity of the patient. This prior technique uses a coil to which is glued a thin, flexible tube filled with baby oil or water. Images produced using this surface coil show bright spots or points indicating the position of the water or oil. These bright points give a good approximation of the surface coil position with respect to the image region. With multiple axial images, an operator can interactively select points within the images corresponding to the coil position. Thereafter, field sensitivity is calculated at all points in all of the subsequent images and the pixel intensities are then normalized through that sensitivity.

There are drawbacks to normalizing images using the above-mentioned technique. In particular, thin, flexible tubes filled with baby oil or water attached to flexible surface coils are not commercially available. Accordingly, existing commercial probes must be modified, which adds significant costs. Also, as described above, an operator is required to identify manually the position of bright spots representing the tube of oil or water. The determination of the surface coil shape and orientation is only as good as the operator's manual ability to identify and correctly pick bright spots produced in the resulting images. Further, the manual determination of the bright spots is only a general approximation of the surface coil position within the images. The tubes of baby oil or water being adhered to the surface coil are physically offset from the actual coil segments.

The present invention provides a new and improved apparatus and method of automated determination of image region coordinates of the surface coil which overcomes the above-referenced problems and others.

SUMMARY OF THE INVENTION

In accordance with one aspect of the present invention, a surface coil is positioned within an image region to detect radio frequency resonance signals generated therefrom. The detected signals are used to reconstruct magnetic resonance images representing cross-sectional views of the image region. A filter smooths a first set of magnetic resonance images representing a pair of orthogonal views through the surface coil. An image intensity gradient circuit calculates magnitudes and directions of pixel intensity gradients at each pixel in the first set of images. Thereafter, a surface coil coordinate calculator calculates image region coordinates of the surface coil from resonance signal intensities, gradient magnitudes, and gradient directions In accordance with a more limited aspect of the present invention, from the coordinates of the surface coil, a surface coil sensitivity profile is calculated which, in turn, is used to normalize and enhance magnetic resonance image obtained through use of the surface coil.

In accordance with another aspect of the present invention, pixels corresponding to the surface coil are identified in each image of the first set as having a low resonance signal intensity and as being positioned nearest a reference pixel on a line extending therefrom in a gradient direction thereof, where the reference pixel corresponds to a pixel in each image having a maximum resonance signal intensity and gradient magnitude multiplied product.

In accordance with yet another aspect of the present invention, pixels in each image of the first set corresponding to the surface coil are identified as being near an intersection of lines extending from a pair of reference pixels where the reference pixels are identified as corresponding to pixels with the largest resonance signal intensity and gradient magnitude multiplied product.

In accordance with yet another aspect of the present invention, resonance signal intensity gradients are generated by convolving the first set of images with convolution kernels for edge enhancement.

In accordance with yet another aspect of the present invention, resonance signal intensity gradients are generated by fourier transforming the first set of images into frequency domain equivalents, multiplying the frequency domain equivalents by weighted values, and inverse fourier transforming the multiplied values into spacial domain equivalents.

One advantage of the present invention is that it can modify magnetic resonance images to correct for the inhomogeneity of the surface coil's sensitivity.

Another advantage of the present invention is that image region coordinates of the surface coil are automatically identified without human intervention.

Another advantage of the present invention is that it can be used in conjunction with flexible surface coils attached to existing catheter balloons without significant modification.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
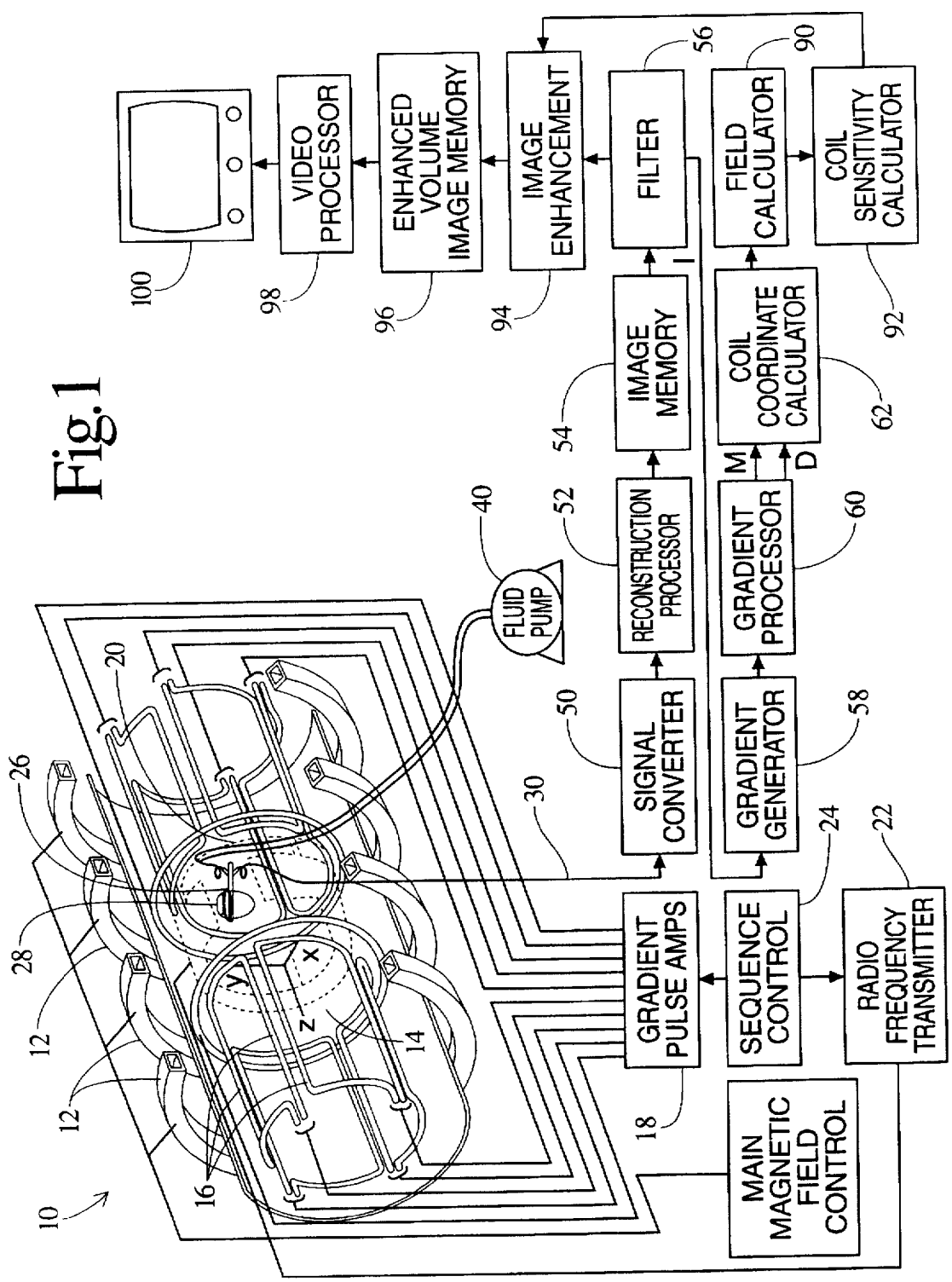
FIG. 1 is a diagrammatic illustration of a magnetic resonance imaging system in accordance with the present invention.

With reference to FIG. 1, a magnetic resonance imaging apparatus 10 includes a main magnetic field coil 12 for establishing a generally static, main magnetic field longitudinally through an image region 14 along a z-axis. Gradient field coils 16 receive current pulses from gradient amplifiers 18 for selectively producing magnetic field gradients transversely across the main magnetic field of the image region 14 along x, y, and z-axes. A magnetic resonance excitation coil 20 (shown in phantom) receives radio frequency signals from a transmitter 22 to excite magnetic resonance in nuclei of the patient tissue disposed within the gradient field. The patterns and timing of the gradient current and radio frequency pulses are controlled by a sequence controller 24 to produce spin echo, field echo, and other imaging sequences as are known in the art. The resonating nuclei generate radio frequency resonance signals which are detected by a flexible surface coil 26 positioned within the image region 14. More specifically, the flexible surface coil 26 is disposed within a preselected cavity of the patient so that the flexible surface coil 26 is closely proximate to internal tissue of interest. In the illustrated embodiment, the intra-cavity flexible surface coil is attached circumferentially to an inflatable balloon 28. However, it will be apparent to those skilled in the art that the present invention is adaptable to other balloon attachments and for use with rigid surface coils positioned internal or external to the patient to be imaged.

Figure 2:
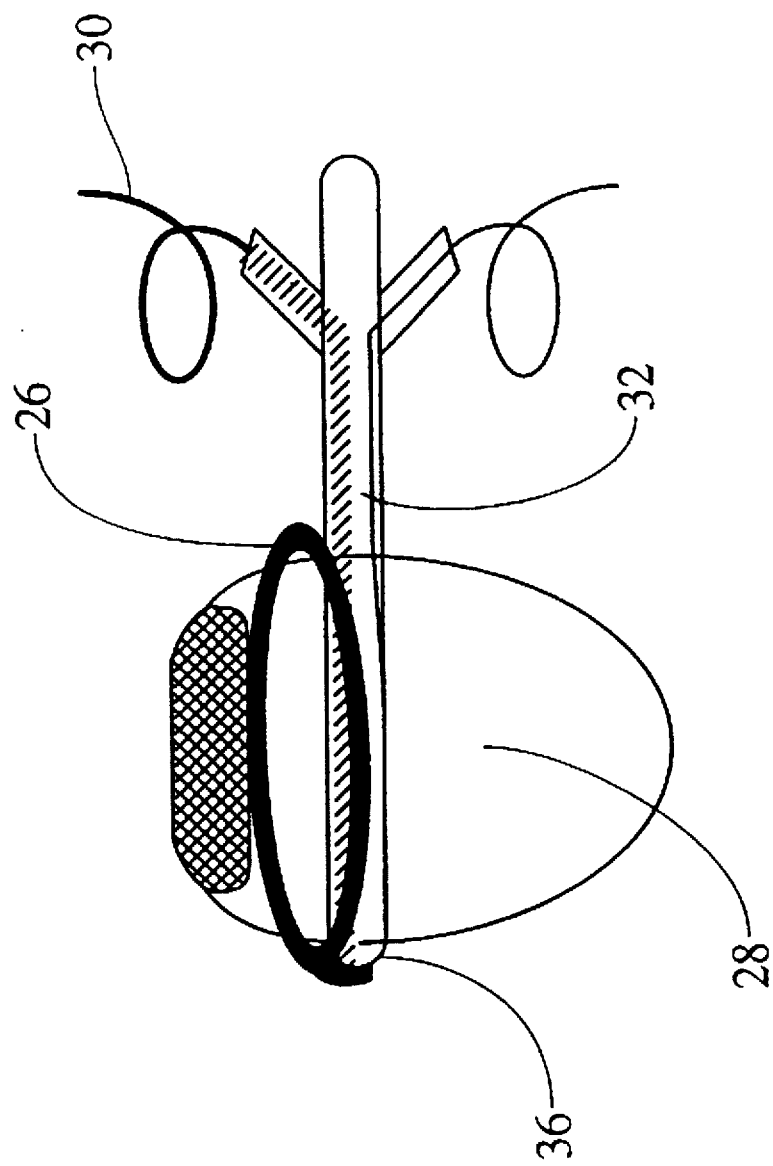
FIG. 2 is a schematic illustration of the flexible surface coil mounted to an inflatable balloon.

With continuing reference to FIG. 1 and further reference to FIG. 2, the flexible surface coil 26 is wrapped around the balloon 28, for example, of an Iowa safety tip (No. 9336) catheter. A coaxial transmission cable 30 passes through a lumen 32 of the catheter. In the lumen, near the center of the balloon, the coaxial cable 30 is connected to the flexible surface coil 26 which is, in turn, sheathed in medical grade tubing. More specifically, the flexible surface coil is constructed of a braided copper wire, copper foil, or other flexible radio frequency conductor that are sheathed in the medical grade tubing or other biologically compatible insulator. The flexible surface coil 26 passes out of tip 36 of the catheter and is fastened to the surface of the balloon 28. Fluid pressure applied to the inside of the balloon by fluid pump 40 causes the balloon 28 to expand which thereby expands the flexible surface coil 26 into a roughly elliptical shape. When expanded, the flexible surface coil 26 is pressed against adjacent tissue for more efficient detection of radio frequency resonance signals originating from the adjacent tissue.

The detected radio frequency resonance signals are conveyed by the coaxial cable 30 to downstream circuitry described below where they are processed into initial magnetic resonance images representing cross-sectional views through the image region 14.

Prior to describing the downstream image circuitry, the theory of the present invention is now presented. The flexible surface coil 26 is positioned at an interface between tissue and air of the inflated balloon. Initial magnetic resonance images exhibit this tissue-air interface as a sharp demarcation between bright tissue and dark or black air of the inflated balloon. Image pixels corresponding to the coil are found adjacent to the brightest pixels at the steepest interface between bright and dark pixels. Since detected resonance signal intensity is highest nearest the coil, tissue most closely adjacent to the flexible surface coil is brightest. Additionally, there is no resonance signal (other than noise) where the coil is actually located. Nor is there resonance signals emanating from the balloon. Moreover, signal intensity drops off rapidly with displacement from the coil. Under these principles, the present invention uses resonance intensity and resonance intensity gradient data to identify image region coordinates of the flexible surface coil. Once the image region coordinates of the flexible surface coil are calculated, the remaining circuitry corrects or normalizes the magnetic resonance images using a calculated surface coil sensitivity profile.

Returning now to FIG. 1, a signal converter 50, such as a digital receiver, receives and demodulates the detected radio frequency resonance signals into resonance data. The type of scan used in collecting the resonance data is not critical. Either spin echo or field echo generating techniques can be used so long as adequate signal to noise ratios are obtained for the resonance data. Superior results should be obtained with subsequent images that are primarily spin density weighted since these tend to have the least tissue contrast and hence the least non-coil related signal gradient.

A reconstruction processor 52 receives and reconstructs the resonance data into electronic volume image representations representing the image region 14. The image representations are stored in an image memory The magnetic resonance image representations are comprised of a three-dimensional rectangular grid of pixels, each digital value indicative of resonance signal intensity I of a corresponding image region coordinate P.

A filter 56 smooths a first set of magnetic resonance slice images representing axial and transverse slices through the flexible surface coil 26 and the inflatable balloon 28. This first set of axial and transaxial pilot images are obtained to determine an approximate position of the surface coil 26 relative to the image region 14. The images are selected to completely cover the flexible surface coil 26 with one or two slices beyond both ends to insure complete coverage. The central slice, e.g., slice no. 9 in a 17-slice acquisition, should be approximately in the center of the surface coil 26, or balloon 28 around which the coil is wrapped. The position of the surface coil 26 is not known but the position of the balloon 28 is obvious from the images. Contiguous views give the best estimate of coil position, but since the coil is a smoothly changing object, fewer views with gaps in between can be used to speed the coil coordinate identification process.

After the first set of magnetic resonance images are smoothed, an intensity gradient generating circuit processes the resonance signal intensities I and generates orthogonal, resonance intensity gradients. The resonance intensity gradients are defined as the change of resonance intensity I at a pixel position with respect to resonance intensities I of adjacent pixels. The gradients are generated in one of two ways. In the first instance, the smoothed first set of images are convolved with appropriately weighted kernels. The simplest, by way of example, is a 3×3 kernel with the following weights:

| -1 0 1 | | -1 -2 -1 |
|--------|----|---------|
| -2 0 2 | or | 0 0 0 |
| -1 0 1 | | 1 2 1 |

Convolving with the above kernels produces a gradient value for each pixel which values represent resonance intensity gradients along the x and y-directions relative to z-axis.

In the alternative, the resonance intensity gradients can be calculated using a Fourier transform. Here, the gradients are obtained by (1) performing a two-dimensional fast Fourier transform on each smoothed slice image into the frequency domain, (2) multiplying each row or column by a vector, e.g. {-127, -126, . . . , 0, . . . , 127, 128}, and (3) inverse Fourier transforming the multiplied frequency domain equivalents back into the spatial domain. The fast Fourier transform provides an efficient method by which gradients can be calculated for each pixel of the image. However, if only a small fraction of the image is of interest, gradients can be calculated more efficiently by convolving the limited region with the appropriate kernel as described above. Other methods for calculating gradient values can also be used.

A gradient processing circuit 60 calculates intensity gradient magnitudes M and intensity gradient directions D from the orthogonal, resonance intensity gradients for each pixel of the first set of magnetic resonance images. The intensity gradient magnitudes M are the rate of change (or slope) of the image pixel values and can be calculated by taking the square root of the added squares of the orthogonal intensity gradients. The intensity gradient directions D are preferably calculated by dividing the intensity gradient in the y-direction by the intensity gradient in the x-direction, and taking the arctangent of the division.

A coil coordinate calculator 62 calculates image region coordinates C of flexible surface coil segments AC from the resonance signal intensities I, the intensity gradient magnitudes M, and the intensity gradient directions D. The image region coordinates C are calculated in one of several ways, each of which operates under the principle that pixels corresponding to the flexible surface coil 26 are identified as being adjacent to the brightest pixels at the steepest interface between bright and dark pixels. Once the surface coil pixels are formed, their image region coordinates P are equated to C and held in memory until coil sensitivity calculation.

Figure 3:
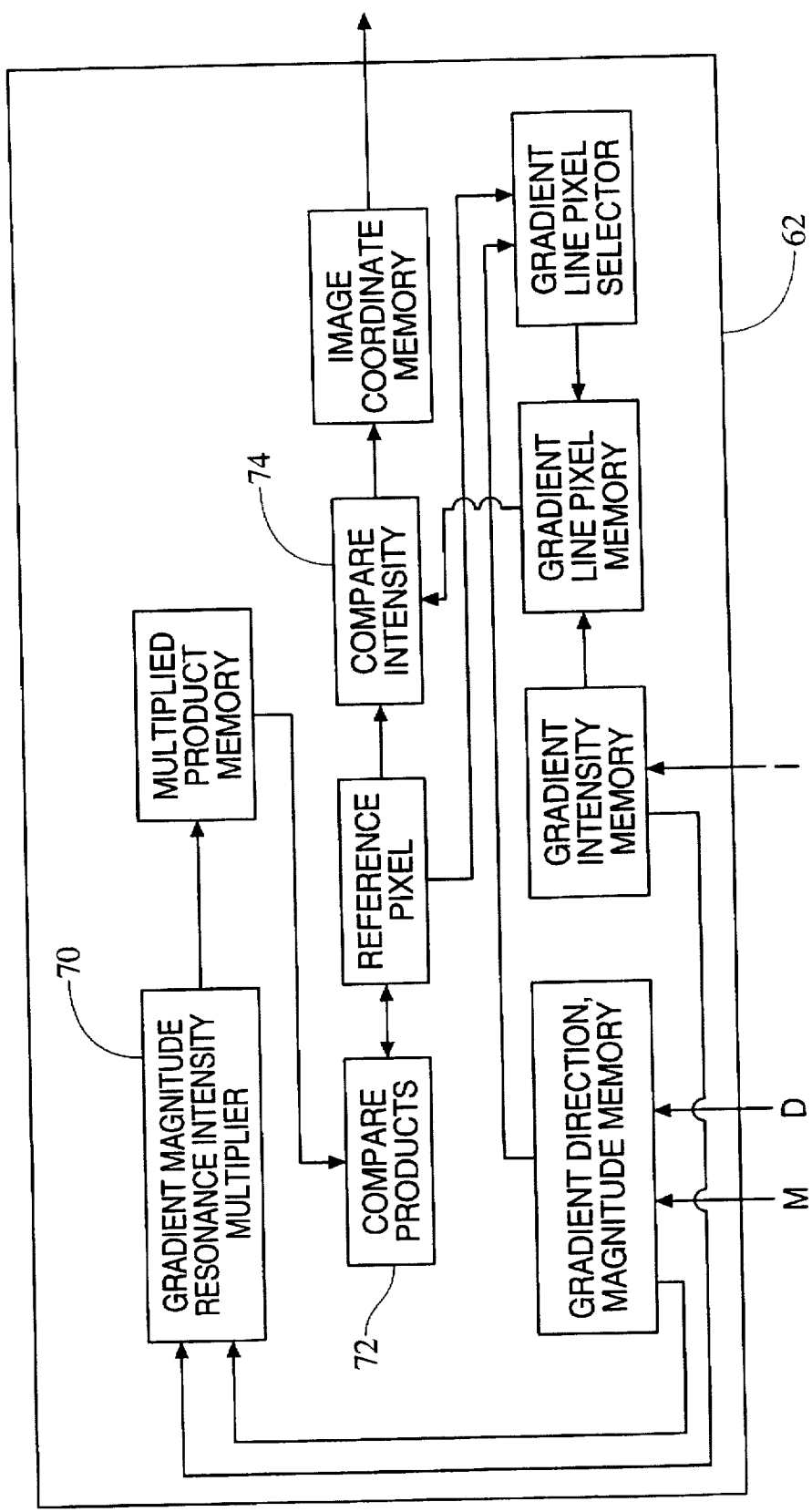
FIG. 3 is a block diagram illustrating one embodiment of the surface coil coordinate calculator.

In the first embodiment shown in FIG. 3, a multiplier 70 multiplies intensity gradient magnitudes M and the resonance signal intensities I for each pixel of the first set of images. The resulting products are compared at first comparator 72 to identify a reference pixel in each image having the greatest resonance signal intensity/gradient magnitude product. The identified reference pixel should not be positioned on an edge of low resonance intensity pixels thereby insuring that the gradient direction associated with the reference pixel is a result of coil sensitivity and is not skewed by a rapid change in signal between tissue and non-tissue. This is accomplished by verifying that none of the reference pixel's eight nearest neighbors have resonance intensities less than ten percent of the reference pixel.

The surface coil pixel in each image is identified by a second comparator 74 as being positioned nearest the reference pixel on a line extending therefrom in the gradient direction D thereof. The comparator 74 compares resonance intensities I to identify the coil pixel which has a resonance intensity less than five percent of the reference pixel and which should be connected with a large body of other low resonance intensity pixels. The surface coil pixel is typically located within a fairly short distance from the reference pixel, i.e., no more than 10 pixel positions in either direction along the gradient line. If, due to random factors, the gradient direction line of the reference pixel is parallel to a surface of non-tissue, there may be no pixels which can be selected as corresponding to the surface coil. In this instance, the search should be expanded to the first pixels on each side of the gradient direction line. At the very least, the second pixel on each side of the gradient direction line will produce the surface coil pixel. Typically, searching within one pixel on each side of the gradient direction line succeeds nearly ninety percent of the time, while searching within two pixels on each side of the gradient direction line succeeds very close to 100% of the time.

Figure 4:
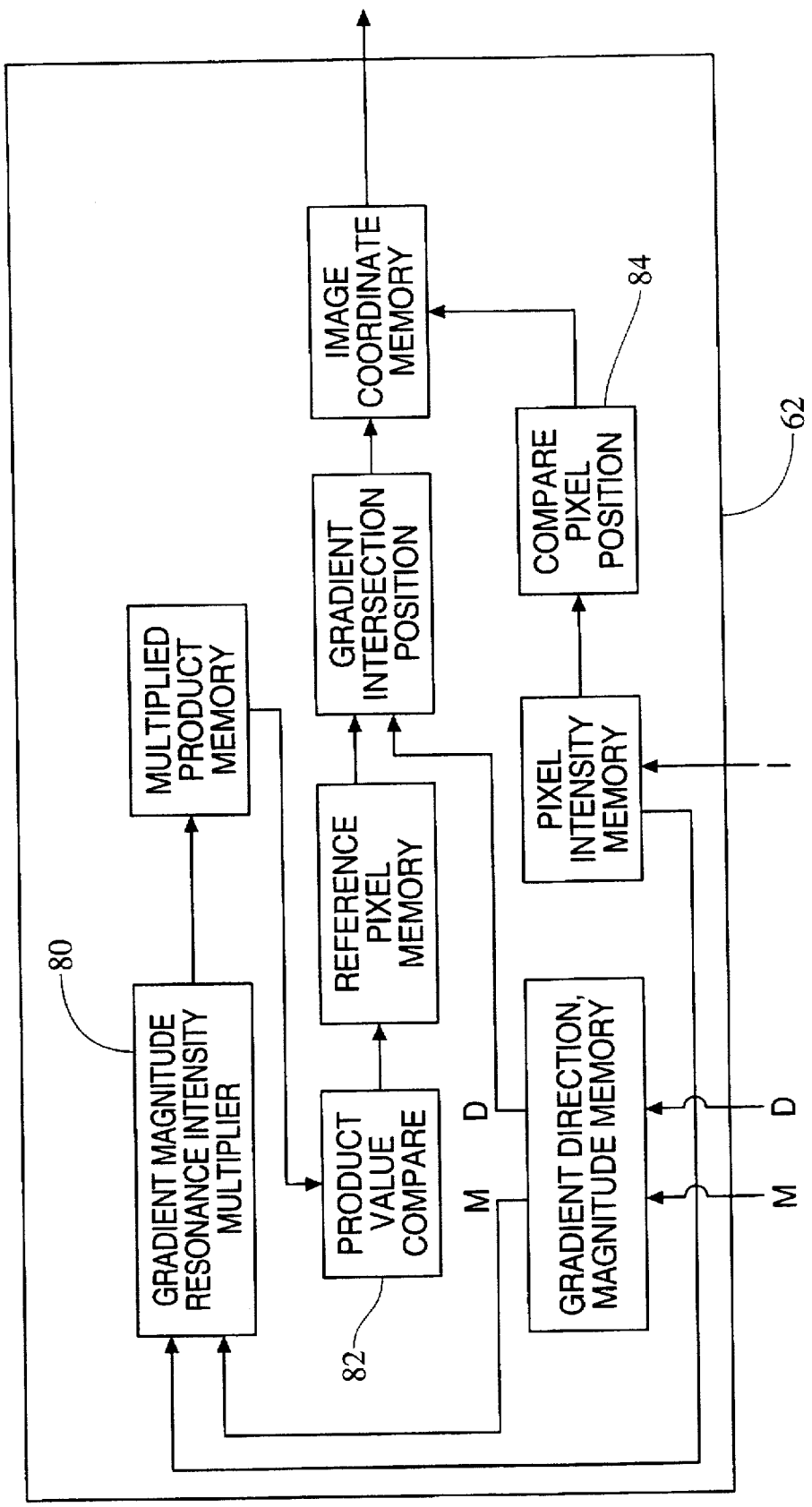
FIG. 4 is a block diagram illustrating a second embodiment of the surface coil coordinate calculator.

In a second embodiment shown in FIG. 4, the intensity gradient magnitudes M and the resonance signal intensities I are multiplied by multiplier 80 for each pixel of the first set of images. A first comparator 82 compares intensity gradient magnitudes/resonance signal intensity multiplied products to identify a pair of reference pixels in each image. The pair of reference pixels are typically contained within an 11×11 matrix and correspond to the first and second greatest resonance intensity I/gradient magnitude products respectively. A second comparator 84 identifies the flexible surface coil as being positioned on or near an intersection of lines extending from the reference pixel pair in gradient directions D thereof. The gradient direction angles of the pair should have at least a 10° difference. The second comparator compares the resonance signal intensities to insure that the pixel nearest the point of intersection has a resonance intensity I greater than 10% of either reference pixel of the pair. If this condition is not met, then the nearest neighboring pixel with a resonance intensity less than 10% is selected as the correct surface coil pixel.

A third embodiment utilized in finding the surface coil pixels uses a listing of pixels surrounding a reference pixel corresponding to the maximum resonance intensity/gradient magnitude product. In this instance, the pixels in an 11×11 matrix surrounding the reference pixel, are prioritized in a list according to the angle of their gradient directions. Each pixel within this list should be surrounded by pixels with a resonance intensity greater than 10% of the reference pixel. After the list is compiled, and assuming there are n pixels, an intersection is calculated between a line corresponding to the gradient of the first pixel and a line corresponding to the gradient of an n/2 pixel. Thereafter, an intersection is calculated between a line extending from the second pixel and a line extending from the n/2+1 pixel. This process continued until n/2 intersections have been calculated. Thereafter, an average intercept position is calculated along with a statistical test excluding any outliers, i.e., points that do not belong. Typically, this procedure almost always results in an average intersection on a pixel positioned within the balloon. However, should the resonance signal intensity of this pixel be greater than 10% of the reference pixel, then a search is performed for the closest pixel with a resonance intensity less than 10%.

Each image of the first set contains two surface coil pixels. To identify the second coil pixel, pixels within a 20×20 matrix surrounding the first identified coil pixel are zeroed. Thereafter, the second reference pixel is identified using any one of the foregoing techniques.

Since the surface coil is a smoothly changing object, the search for surface coil pixels in subsequent and adjacent axial images can be confined to the same image position plus or minus 10 pixels. Normally, the coil pixels do not change more than plus or minus 3 pixels.

The technique for finding the surface coil pixels within the axial images begins to fail for images at the far ends of the surface coil. Once it is determined that the surface coil is curving inward, the search continues using the transaxial images of the first set beginning with the transaxial image having the farthest gap in the z-direction. Although field line distribution is significantly different in the axial images, the search techniques used by the coil coordinate calculator described above are applicable since coil sensitivity changes more rapidly near the surface coil.

The techniques set forth above can be applied to any type of surface coil, including a rigid surface coil, that is in close proximity to the body tissue of interest. However, if any part of the coil becomes distanced from the tissue by more than approximately 10% of the coil's diameter, then the field starts to become more uniform and the prediction of the coil location becomes more difficult. If the coil is rigid and its shape is known, it may still be possible to calculate its overall position, but the computational task is more difficult.

After the surface coil pixels are identified within the first set of images, a magnetic field calculation circuit 90 (FIG. 1) calculates a magnetic field B producible by the flexible surface coil at each image region coordinate P corresponding to pixels of a selected magnetic resonance image where B equals:

$$B(P) = \frac{\mu_0 I}{4\pi} \int_{coil} \frac{I \times (P - C)}{|P - C|^3} dC, \quad (1)$$

and I defines a direction of current flow through the coil. Equation (1) can be rewritten to simplify implementation on a digital computer as being proportional to:

$$B(P) = \Sigma_{coil} \frac{\Delta C \times (P - C)}{|P - C|^3} . \quad (2)$$

A coil sensitivity calculator 92 calculates flexible surface coil sensitivity S at each image region coordinate P of the selected magnetic resonance image where S is proportional to:

$$S \alpha \sqrt{B_x^2 + B_y^2} , \quad (3)$$

where $B_x$ and $B_y$ are the orthogonal components of the magnetic field B calculated by the magnetic field calculation circuit.

An image enhancement circuit 94 normalizes the image representation by dividing the resonance signal intensity I for each pixel by the corresponding flexible surface coil sensitivity S of the corresponding pixel, thereby enhancing the image's resolution.

The enhanced image representation is stored in an enhanced volume image memory 96. A video processor 98 selectively converts slices, volumes, surface renderings, and the like from the enhanced image memory to appropriate format for display on a human-readable display 100, such as a CRT monitor, CCD display, active matrix display, or the like.

In most clinical applications of surface coil imaging, the initial magnetic resonance images are produced without modification, i.e., no correction is made for the inhomogeneity of the surface coil's sensitivity. As a result, the images can be difficult to decipher. Near the coil, the resonance sensitivity can be so great that a region of the resulting image can be completely washed out. Moving away from the coil, the resonance intensity drops off rapidly until the intensity is overwhelmed by background noise. With the position of the surface coil known relative to images obtained, coil sensitivity can be calculated which then can be used to normalize or correct the resulting images, thereby making them more resonance intensity uniform.

It will no doubt be appreciated that the present invention may be accomplished with either software, hardware, or a combination of software/hardware implementations.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance imaging apparatus having a main magnetic field coil for generating a main magnetic field along an image region, gradient coils for generating magnetic field gradients across the main magnetic field, a magnetic excitation coil for exciting nuclei within the image region to resonate and generate radio frequency resonance signals, a surface coil positioned within the image region for detecting radio frequency resonance signals, a signal converter for converting the detected radio frequency resonance signals into resonance data, a reconstruction processor for reconstructing the resonance data into a volumetric magnetic resonance image representation of the image region, the magnetic resonance image representation including an image value corresponding to each of a three-dimensional array of pixels, image values lying on and adjacent a selected plane are addressable to create a selected slice image representation, the improvement comprising:

a gradient processing circuit which calculates magnitudes and directions of pixel intensity gradients from the image values for each pixel of a first set of selected slice image representations which represent crossing planes through the image region; and, a surface coil coordinate calculator which calculates an image region coordinate for each of a plurality of segments of the surface coil, from the image values and the pixel intensity gradients of the first set of selected slice image representations.

2. In the magnetic resonance imaging apparatus of claim 1, the improvement further comprising:

a field calculator for calculating a field attributable to the surface coil from the calculated surface coil coordinates; and an image enhancement circuit for correcting the first set of selected slice image representations in accordance with the calculated field.

3. In the magnetic resonance apparatus as set forth in claim 1, the improvement further comprising:

a coil sensitivity calculator for calculating a coil sensitivity at each pixel of the three-dimensional pixel array from the image region coordinates for the plurality of surface coil segments;

an image enhancement circuit for correcting the image value corresponding to each pixel with a coil sensitivity corresponding to the same pixel.

4. A magnetic resonance imaging apparatus comprising:

a main magnetic field coil for generating a temporally constant main magnetic field through an imaging region;

gradient coils for generating magnetic field gradients across the main magnetic field;

a magnetic excitation coil for exciting nuclei within the imaging region to resonate and generate radio frequency resonance signals;

a surface coil positioned within the image region for detecting the radio frequency resonance signals;

a signal converter for converting the detracted radio frequency resonance signals into resonance data;

a reconstruction processor for reconstructing the resonance data into a magnetic resonance image representation of resonating nucleus density in the image region, the magnetic resonance image representation being defined by an array of numerical image values each corresponding to one of a rectangular array of pixel coordinates, such that image values lying on and adjacent a selected plane are addressable to create a selected slice image representation;

an intensity gradient generating circuit which processes the numerical values to generate intensity gradients each indicative of a rate of change of the numerical values across the rectangular array;

a gradient processing circuit which generates an intensity gradient magnitude and an intensity gradient direction from the intensity gradients for each pixel of a first set of selected slice image representations which represent crossing planes through the imaging region;

a surface coil coordinate calculator which calculates pixel coordinates corresponding to locations in the imaging region occupied by segments of the surface coil from the numerical values, the intensity gradient magnitudes, and the intensity gradient directions of the first set of selected slice image representations;

a magnetic field calculation circuit for calculating a field inducible by the surface coil from the calculated pixel coordinates;

a surface coil sensitivity calculator for calculating surface coil sensitivity at each pixel coordinate from orthogonal components of the calculated field; and, an image enhancement circuit which enhances the magnetic resonance image representation by adjusting the numerical image value with the surface coil sensitivity at a corresponding pixel coordinate.

5. The magnetic resonance imaging apparatus of claim 4 wherein the surface coil coordinate calculator includes:

a multiplying circuit which multiplies the intensity gradient magnitude and the numerical value for each pixel of the first set of selected slice image representations to generate a product value corresponding to each pixel;

a first comparator for comparing the product values to identify first and second reference pixels corresponding to first and second maximum product values, respectively, the first and second reference pixels being separated by at least 10 intervening pixels;

a second comparator which (1) compares, for each slice image representation of the first set, the numerical value corresponding to the first reference pixel with the numerical values corresponding to pixels positioned along a line extending from the first reference pixel in a gradient direction corresponding to the first reference pixel to identify a first surface coil pixel at a pixel coordinate nearest the first reference pixel and having a corresponding numerical value less than $1/10$-th of the numerical value of the first reference pixel, and (2) compares the numerical value corresponding to the second reference pixel with numerical values corresponding to pixels positioned on a line extending from the second reference pixel in the intensity gradient direction of the second reference pixel, to identify a second surface coil pixel at a pixel coordinate nearest the second reference pixel and having a numerical value less than $1/10$-th of the numerical value of the second reference pixel; and, a memory which stores the first and second surface coil pixels.

6. The magnetic resonance imaging apparatus of claim 4 wherein the surface coil coordinate calculator includes:

a multiplying circuit which multiplies the intensity gradient magnitude by the numerical value for each pixel of the first set of selected slice image representations to generate a corresponding product value;

a first comparator for comparing the product values to identify for each slice image representation of the first set, first and second pairs of reference pixels corresponding to first and second pairs of maximum product values, the first and second pairs of reference pixels being separated by at least 10 intervening pixels;

a second comparator which compares, for each slice image representation of the first set, pixel coordinates to identify as a first surface coil pixel, a pixel positioned at an intersection of lines extending from the first pair of reference pixels in the intensity gradient directions thereof, and a second surface coil pixel positioned at an intersection of lines extending from the second pair of reference pixels in the intensity gradient directions thereof; and, a memory for storing the first and second surface coil pixels.

7. The magnetic resonance imaging apparatus of claim 4 further comprising a filter for smoothing the magnetic resonance image.

8. The magnetic resonance imaging apparatus of claim 4 wherein the gradient generating circuit includes:

a Fourier transform processor for transforming the numerical values from a spatial domain into frequency domain equivalents;

a multiplier for multiplying the frequency domain equivalents by weighted values; and, an inverse Fourier transform processor for inverse transforming outputs of the multiplier back into the spatial domain.

9. The magnetic resonance imaging apparatus of claim 4 wherein the gradient generating circuit includes:

a convolver for convolving numerical values of the first set of selected slice image representations with convolution kernels.

10. The magnetic resonance imaging apparatus as set forth in claim 4 wherein the surface coil is flexible and further including:

an inflatable balloon attached to the flexible surface coil for selectively pressing the flexible surface coil into closer association with surrounding tissue.

11. The magnetic resonance imaging apparatus of claim 4 wherein the field calculated by the magnetic field calculation circuit is proportional to:

$$\Sigma \frac{\Delta C \times (P-C)}{|P-C|^3},$$

where C are pixel coordinates; P are coordinates in the imaging region, and $\Delta C$ are pixel coordinates of the surface coil.

12. The magnetic resonance imaging apparatus of claim 4 wherein the surface coil sensitivity calculated by the coil sensitivity calculator at each image region coordinate P is proportional to:

$$\sqrt{B_x^2 + B_y^2},$$

where $B_x$ and $B_y$ are orthogonal components of the calculated field.

13. A method of magnetic resonance imaging comprising:

placing a surface coil in contact with a subject within an image region;

generating a main magnetic field through the image region;

causing magnetic field gradients across the main magnetic field;

exciting nuclei within the image region to resonate and generate radio frequency resonance signals;

detecting radio frequency resonance signals using the surface coil;

converting the detected radio frequency resonance signals into resonance data;

reconstructing the resonance data into a magnetic resonance image representation representing resonating nucleus density in the image region, the magnetic resonance image representation being defined by an array of numerical image values each corresponding to a pixel coordinate of an array pixel coordinates;

processing the numerical values to generate image gradients each indicative of a rate of change of the numerical values across the array;

determining image gradient magnitudes along image gradient directions across the magnetic resonance image representation;

calculating pixel coordinates corresponding to locations in the imaging region occupied by segments of the surface coil from the numerical image values, the image gradient magnitudes, and the image gradient directions;

calculating a field inducible by the surface coil from the calculated pixel coordinates;

calculating surface coil sensitivity at each pixel coordinate from orthogonal components of the field; and enhancing the magnetic resonance image representation by adjusting the numerical image values with the surface coil sensitivity at corresponding pixel coordinates.

14. The magnetic resonance imaging method of claim 13 wherein the pixel coordinates represent a three-dimensional grid such that image values lying on and adjacent a selected plane are addressable to create a selected slice image representation, and wherein calculating the pixel coordinates further includes:

multiplying the image gradient magnitude and the numerical image value for each pixel of a first set of selected slice image representations to generate a product value corresponding to each pixel;

comparing the product values to identify first and second reference pixels corresponding to first and second maximum product values, respectively, the first and second reference pixels being separated by at least 10 intervening pixels;

comparing, for each slice image representation, the numerical value corresponding to the first reference pixel with the numerical values corresponding to pixel positioned along a line extending from the first reference pixel in an image gradient direction corresponding to the first reference pixel to identify a first surface coil pixel at a pixel coordinate nearest the first reference pixel and having a corresponding numerical value less than 1/10-th of the numerical value of the first reference pixel;

comparing, for each slice image representation, the numerical value corresponding to the second reference pixel with the numerical image values corresponding to pixels positioned along a line extending from the second reference pixel in an image gradient direction corresponding to the second reference pixel, to identify a second surface coil pixel at a pixel coordinate nearest the second reference pixel and having a corresponding numerical value less than 1/10-th of the numerical value of the second reference pixel; and, storing first and second surface coil pixels.

15. The magnetic resonance imaging method of claim 13 wherein the pixel coordinates represent a three-dimensional grid such that image values lying on and adjacent a selected plane are addressable to create a selected slice image representation, and wherein calculating the pixel coordinates further includes:

multiplying the image gradient magnitude and the numerical value for each pixel of a first set of selected slice image representations, to generate a product value corresponding to each pixel;

comparing the product values to identify for each slice image representation of the first set, first and second pairs of reference pixels corresponding to first and second pairs of maximum product values, the first and second pairs of reference pixels being separated by at least 10 intervening pixels;

comparing, for each slice image representation of the first set, pixel coordinates to identify as a first surface coil pixel, a pixel positioned at an intersection of lines extending from the first pair of reference pixels in the image gradient directions thereof;

comparing, for each slice image representation of the first set, pixel coordinates to identify as a second surface coil pixel, a pixel positioned at an intersection of lines extending from the second pair of reference pixels in the image gradient directions thereof; and storing the first and second surface coil pixels.

16. The magnetic resonance imaging method of claim 13 further including smoothing the first set of selected slice image representations.

17. The magnetic resonance imaging method of claim 13 wherein processing the numerical values to generate gradients further includes:

transforming the numerical values from a spatial domain into frequency domain equivalents;

multiplying the frequency domain equivalents by weighted values; and, inverse transforming the multiplied frequency domain equivalents back into the spatial domain.

18. The magnetic resonance imaging method of claim 13 wherein generating gradients further includes convolving the numerical values of the first set of selected slice image representations with convolution kernels.

19. A method of magnetic resonance imaging comprising:

placing a surface coil in contact with a subject within an imaging region;

generating a main magnetic field through the image region;

causing magnetic field gradients across the main magnetic field;

exciting nuclei within the imaging region to resonate and generate radio frequency resonance signals;

detecting the radio frequency resonance signals;

converting the detected radio frequency resonance signals into resonance data;

reconstructing the resonance data into a magnetic resonance image representation of the imaging region, the magnetic resonance image representation including an image value corresponding to each of a three-dimensional array of pixels, such that image values lying on and adjacent a selected slice are addressable to create a selected slice image representation;

generating an image value gradient magnitude and an image value gradient direction from the image values for each pixel of a first set of selected slice image representations which represent crossing slices through the imaging region; and, calculating an image region coordinate for each of a plurality of segments of the surface coil from the image values, the image value gradient magnitudes, and the image value gradient directions of the first set of selected slice image representations.

20. The magnetic resonance imaging method of claim 19 further including:

calculating a field attributable to the surface coil from the calculated surface coil segment coordinates; and, correcting the magnetic resonance image representation in accordance with the calculated field.

21. The magnetic resonance imaging method of claim 19 further including:

calculating a coil sensitivity at each pixel of the three-dimensional pixel array from the calculated surface coil segment coordinates; and, correcting the image value corresponding to each pixel with a coil sensitivity corresponding to the same pixel.

\* \* \* \* \*